(12) United States Patent
Shibata

(10) Patent No.: US 7,247,518 B2
(45) Date of Patent: Jul. 24, 2007

(54) SEMICONDUCTOR DEVICE AND METHOD FOR MANUFACTURING SAME

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 165 days.

(21) Appl. No.: 10/727,577

(22) Filed: Dec. 5, 2003

(65) Prior Publication Data

US 2004/0115867 A1    Jun. 17, 2004

Related U.S. Application Data

(62) Division of application No. 10/284,318, filed on Oct. 31, 2002, now Pat. No. 6,867,501.

(30) Foreign Application Priority Data

Nov. 1, 2001 (JP) ............................. 2001-336827
Nov. 2, 2001 (JP) ............................. 2001-338110

(51) Int. Cl.
   *H01L 21/50* (2006.01)
(52) U.S. Cl. ..................... 438/108; 438/109; 438/458; 438/459
(58) Field of Classification Search ................ 438/108, 438/109, 110, 455, 458, 459, 692
See application file for complete search history.

(56) References Cited

U.S. PATENT DOCUMENTS

| | | | | |
|---|---|---|---|---|
| 5,627,106 A | * | 5/1997 | Hsu .......................... | 438/459 |
| 5,783,870 A | * | 7/1998 | Mostafazadeh et al. ..... | 257/791 |
| 5,790,384 A | * | 8/1998 | Ahmad et al. ............... | 361/760 |
| 5,825,080 A | * | 10/1998 | Imaoka et al. .............. | 257/659 |
| 6,486,544 B1 | * | 11/2002 | Hashimoto ................... | 257/686 |
| 6,498,053 B2 | * | 12/2002 | Mastromatteo et al. ..... | 438/107 |
| 6,633,081 B2 | * | 10/2003 | Sahara et al. ............... | 257/738 |
| 6,642,081 B1 | * | 11/2003 | Patti ........................... | 438/109 |
| 2005/0224921 A1 | * | 10/2005 | Gupta et al. ................ | 438/459 |

FOREIGN PATENT DOCUMENTS

| | | |
|---|---|---|
| JP | 1-218042 | 8/1989 |
| JP | 10-502493 | 3/1998 |
| JP | 10-223833 | 8/1998 |
| JP | 11-345933 | 12/1999 |
| JP | 200-323645 | 11/2000 |
| JP | 2001-53218 | 2/2001 |
| JP | 2001-57404 | 2/2001 |
| JP | 2001-168275 | 6/2001 |
| JP | 2001-177045 | 6/2001 |
| JP | 2001-196525 | 7/2001 |
| JP | 2001-319995 | 11/2001 |

* cited by examiner

*Primary Examiner*—Mary Wilczewski
*Assistant Examiner*—Toniae M. Thomas
(74) *Attorney, Agent, or Firm*—Rabin & Berdo P.C.

(57) ABSTRACT

There is provided a semiconductor device of a chip-on-chip structure having a support semiconductor chip, first and second chip blocks supported and connected on one surface of the support semiconductor chip and an insulator arranged between the first and second chip blocks. The first and second chip blocks each include one or a plurality of semiconductor chips having an active surface nearly parallel with the one surface of the support semiconductor chip. Within the insulator, an intralevel wiring is arranged on a wiring plane as a plane including an inactive or active surface of any of the semiconductor chips structuring the first or second chip block.

11 Claims, 5 Drawing Sheets

SEMICONDUCTOR DEVICE AND METHOD FOR MANUFACTURING SAME

This is a Divisional of U.S. application Ser. No.: 10/284,318, filed Oct. 31, 2002 now U.S. Pat. No. 6,867,501.

BACKGROUND OF THE INVENTION

1. Field of the Invention

The present invention relates to a semiconductor device of a chip-on-chip structure that has a semiconductor chip bonded with other semiconductor chips thereon, and to a method for manufacturing same.

2. Description of Related Art

There are semiconductor devices increased in integration degree, including system-on-chips (SOCs) and multi-chip modules (MCMs). In the system-on-chip, the functions conventionally realized on a plurality of ICs are integrated on one semiconductor chip. Meanwhile, the multi-chip module is structured by a plurality of semiconductor chips arranged with density on a wiring board of glass-epoxy or the like. Each of them has multiple functions as one semiconductor device and can be size-reduced as compared to a combination of a plurality of semiconductor devices realizing the equivalent functions. Meanwhile, this reduces the wiring length in the overall, enabling high-speed transmission of signals.

However, the system-on-chip is complicated in manufacture process, requiring a huge amount of capital investment and hence high manufacture cost. Meanwhile, the multi-chip-module has a plurality of semiconductor chips mutually arranged side by side on a wiring board. Because these semiconductor chips are connected by wirings, the size is greater as compared to the system-on-chip and hence integration degree lowers.

On the other hand, there is a chip-on-chip structure as one form of an integration increased semiconductor device. The chip-on-chip-structured semiconductor device has a structure having a plurality of semiconductor chips that are oppositely placed for mutual connection. Such a semiconductor device is not configured with an integration of the functions conventionally realized on a plurality of ICs (semiconductor chips) as in the system-on-chip. Consequently, the manufacture process is not so complicated as that of the system-on-chip. Therefore, there is a merit to reduce the manufacturing cost.

The chip-on-chip-structured semiconductor devices include those having a plurality of small semiconductor chips (child chips) arranged side by side on one large semiconductor chip (parent chip). Such a semiconductor device, at a glance, is similar in structure to the multi-chip module having a plurality of semiconductor chips arranged side by side on a wiring board.

In the chip-on-chip-structured semiconductor device, however, the parent chip not only serves as a wiring board to connect between the child chips but also acts itself as a semiconductor chip having functional elements. This results in higher integration degree. On the other hand, the wiring formed on the parent chip, made by a semiconductor process, is by far finer than the wiring of a wiring board of a multi-chip-module. This allows the functional elements of the semiconductor chips (parent and child chips) to be connected at a short length of wiring, whereby signal transmission speed can be increased higher as compared to that of the multi-chip module.

The chip-on-chip-structured semiconductor devices include those that a child chip has, further, one or a plurality of child chips vertically superposed thereon. Namely, such a semiconductor device has a structure connected, on a parent chip, with one or a plurality of chip blocks each having one or a plurality of superposed semiconductor chips. This structure realizes a highly integrated semiconductor device.

In such a semiconductor device, however, the wiring between arbitrary two of the semiconductor chips is provided necessarily through a wiring plane (usually, active surface) of the parent chip, thereby increasing the mean wiring length. Namely, in the case the semiconductor chip is in a position close to the top end of the chip block (position distant from the parent chip), there is an increased length of wiring between that semiconductor chip and the parent chip. Consequently, signals could not be transmitted at sufficient high speed. Meanwhile, even if the wiring length is tried to decrease throughout the entire semiconductor device, there is encountered a low freedom in design, e.g. restriction in semiconductor chip arrangement.

SUMMARY OF THE INVENTION

It is a first object of the present invention to provide a semiconductor device which can increase signal transmission speed.

A second of object of the invention is to provide a semiconductor device high in design freedom.

A third object of the invention is to provide a manufacturing method for obtaining a semiconductor device increased in integration degree.

A fourth object of the invention is to provide a manufacturing method for a semiconductor device low in manufacture cost.

A fifth object of the invention is to provide a semiconductor device increased in integration degree.

A sixth object of the invention is to provide a semiconductor device low in manufacture cost.

A semiconductor device according to one aspect of the invention comprises: a support semiconductor chip; first and second chip blocks supported and connected on one surface of the support semiconductor chip and respectively including one or a plurality of semiconductor chips having an active surface substantially parallel with the one surface of the support semiconductor chip; an insulator arranged between the first and second chip blocks; and an intralevel wiring arranged within or on a surface of the insulator, on a wiring plane which includes an inactive or active surface of any of the semiconductor chips constituting the first or second chip blocks.

Because the semiconductor chips constituting the first and second chip block have an active surface substantially parallel with one surface (e.g. active surface) of the support semiconductor chip, the wiring plane is substantially parallel with the one surface of the support semiconductor chip.

When the semiconductor chip belonging to the first chip block (hereinafter, referred to as "first block chip" in this section) has an active or inactive surface on the wiring plane, the intralevel wiring can be connected to the first block chip. When the active surface of the first block chip is on the wiring plane, the intralevel wiring can be made in direct connection, for example, to a wiring formed on the active surface.

In such a case, the intralevel wiring can be extended to a vicinity of the second chip block, to connect a semiconductor chip positioned in the vicinity of the wiring plane of among the semiconductor chips belonging to the second chip block (hereinafter, referred to as "second block chip" in this section) to the intralevel wiring. Namely, because the first block chip and the second block chip can be directly connected together without passing through other semiconductor chips or the support semiconductor chip, the wire length for interconnection is short. Accordingly, such a semiconductor device can increase signal transmission speed.

In this manner, because the semiconductor chips belonging to the different chip blocks can be connected together at a short distance, there is a freedom in respect of semiconductor chip arrangement. Namely, such a semiconductor device has a high design freedom.

The number of wiring planes may be one or a plurality. On one wiring plane may be arranged one intralevel wiring or a plurality of intralevel wirings. The insulator may be of a resin (e.g. polyimide resin) provided to seal the first and second chip blocks, for example. Three or more chip blocks may be connected on one support semiconductor chip. Also in this case, because freedom is high in respect of semiconductor chip arrangement, freedom is high in designing a semiconductor device.

The active or inactive surface of any of the semiconductor chip constituting the first chip block and the active or inactive surface of any of the semiconductor chip constituting the second chip block may be commonly on the wiring plane. According to this structure, there exists, on one wiring plane, the active or inactive surface of the first block chip and the active or inactive surface of the second block chip. In the case these two semiconductor chips respectively have internal-connection electrodes or wirings on their active or inactive surfaces, electrical connection can be made between these two semiconductor chips only by an intralevel wiring. Accordingly, because such a semiconductor device has a short wiring length, signal transmission speed can be increased.

Of among the first and second block chips, the lowermost semiconductor chips (close to the support semiconductor chip) have a short wiring length if they are connected by the wiring formed on the support semiconductor chip. However, there are usually a multiplicity of wirings formed on the support semiconductor substrate. Consequently, by connecting the lowermost semiconductor chips by an intralevel wiring to disperse the distribution of wirings, there is a case the integration degree on the semiconductor device can be resultingly increased.

The interlevel wiring may include first and second intralevel wirings respectively arranged on first and second wiring planes which are not in a same plane. in this case, it is preferred to include an interlevel wiring connecting between the first and second intralevel wirings.

The interlevel wiring can provide a wiring vertical to the support semiconductor chip. Consequently, a combination of intralevel and interlevel wirings can provide a wiring in an arbitrary direction. This makes it possible to mutually connect between the first and second block chips not having an active nor inactive surface on a same wiring plane. Namely, an intralevel wiring is provided on wiring planes respectively including the active or inactive surfaces of the first and second block chips. By making the two intralevel wirings in a state connected by an interlevel wiring, the first and the second block chips are made into a state of mutual connection.

Also, there is no need that the two semiconductor chips to be connected together by intralevel and interlevel wirings are necessarily belong to different chip blocks (first and second chip block), i.e. they may belong to the same chip block. The wiring plane may further include a wiring plane (usually, active surface) of the support semiconductor chip.

One of the first and second wiring planes may be a wiring plane of the support semiconductor chip.

In this manner, because mutual connection is possible between a plurality of semiconductor chips not having active or inactive surfaces on a same wiring plane, design freedom of semiconductor device can be improved.

It is preferred that at least one of the semiconductor chips constituting the first and second chip blocks has a penetration hole arranged with a conductor therein. The conductor in the penetration hole can be arranged in a thickness direction of the semiconductor chip, to electrically connect between the active and inactive surfaces of the semiconductor chip. On the active surface of the semiconductor chip, the conductor can be connected to a wiring or the like formed on the active surface. Due to this, even where the wiring plane is on a surface including the inactive surface of the semiconductor chip, the intralevel wiring can be directly connected to that semiconductor chip by the conductor arranged in the penetration hole.

With the conductor, connection can be made between the active surface of the semiconductor chip and the intralevel wiring at a short distance (nearly equal to a thickness of the same semiconductor chip) by the penetration hole. Consequently, the signal transmission speed on the semiconductor device can be increased by shortening the wiring length.

The conductor may be filled in the penetration hole or arranged in a part of the penetration hole (e.g. on an inner peripheral wall). In the case the conductor is filled in the penetration hole, the conductor can be formed by using a conductor paste, for example.

A method for manufacturing a semiconductor device of the invention includes: a step of an on-substrate connecting step of connecting face down a semiconductor chip having an active surface formed with a recess arranging a conductor therein onto an one surface of a semiconductor substrate; and a step of polishing or abrading an inactive surface of the semiconductor chip to expose the conductor at the inactive surface of the semiconductor after the on-substrate connecting step.

In the semiconductor chip or substrate, the active surface is a surface forming functional elements or wiring thereon while the inactive surface is a surface on a side opposite to the active surface. To connect face down refers to connect a semiconductor chip or the like to a connection member (e.g. semiconductor substrate) with the active surface of the semiconductor chip or the like opposed to the connection member.

The conductor member may be filled in the recess of the semiconductor chip (first semiconductor chip) or arranged in a part of the recess (e.g. along an inner peripheral wall) in a thickness direction of the first semiconductor chip. In the case the conductor is filled in the recess, the conductor can be formed by using a conductor paste. The conductor can be connected to a wiring provided on the active surface of the first semiconductor chip. An internal-connection electrode may be provided on the active surface of the first semiconductor chip.

The semiconductor substrate may be a semiconductor chip (second semiconductor chip). Otherwise, the semiconductor substrate may be a substrate greater in size and including an area corresponding to the second semiconductor chip. Due to this, obtained is a semiconductor device having a chip-on-chip structure that the first and second semiconductor chips are joined together.

By connecting face down the first semiconductor chip on one surface of the semiconductor substrate, the first semiconductor chip is placed in a state the active surface faces the semiconductor substrate while the inactive surface is open. Consequently, it is easy, in this state, to polish or abrade the inactive surface of the first semiconductor chip.

By polishing or abrading the inactive surface of the first semiconductor chip to expose the conductor, obtained is a penetration hole penetrating the first semiconductor chip in the thickness direction. Owing to the conductor arranged in the penetration hole, the penetration hole serves as a via hole or through-hole to electrically connect between the active surface of the first semiconductor chip and the inactive surface thereof. Meanwhile, even after exposing the conductor, polish or abrasion maybe continued to a desired thickness of the first semiconductor chip. This can reduce the thickness of the semiconductor device entirely. Polish may be by a physical process or chemical polish such as etching.

A step may be included of sealing the first semiconductor chip with an insulator after the on-substrate connecting step. The insulator maybe a resin (e.g. polyimide), for example. The insulator may cover and seal the inactive surface of the first semiconductor chip or seal it exposing the inactive surface. In the case sealing is done with the insulator covering the inactive surface of the first semiconductor chip, it is possible to carry out a step that, after the insulator existing on the inactive surface is removed by a step of polish, abrasion, cutting or etching, the inactive surface of the first semiconductor chip is polished or abraded simultaneous with the insulator to expose the conductor.

The first semiconductor chip is made into a mechanically protected state by being sealed with the insulator. It is, accordingly, possible to prevent the first semiconductor chip from being broken or the connection between the first semiconductor chip and the semiconductor substrate from being damaged due to the stress caused upon the later polishing or abrading the first semiconductor chip. Thus, the first semiconductor chip can be worked to a small thickness.

Through the conductor exposed in the inactive surface of the first semiconductor chip, connection is possible with a wiring or another semiconductor chip. Due to this, because the active surface of the first semiconductor chip can be connected to another semiconductor chip at a short distance, a semiconductor device obtained by such a manufacturing method can be made small in size with higher integration degree.

Meanwhile, the semiconductor device obtained by such a manufacturing method is structured with a combination of a plurality of semiconductor chips (first and second semiconductor chips, etc.), similarly to the multi-chip module. Namely, manufacture cost is low because of difference from the integration of all the functions on one semiconductor chip as in the system-on-chip.

In the case the semiconductor substrate is a semiconductor wafer, the on-substrate connecting step preferably includes a step of arranging and connecting the semiconductor chips in plurality in a sideway direction on a semiconductor wafer. In this case, the above method preferably further includes a step of cutting the semiconductor wafer based on a predetermined region including at least one of the semiconductor chips to obtain a semiconductor device having a chip-on-chip structure.

The semiconductor wafer may be arranged with a multiplicity of regions (predetermined regions) each corresponding to the second semiconductor chip. By this manufacturing method, it is possible to carry out an on-substrate connecting step or conductor exposing step, in batch, on the region corresponding to a plurality of second semiconductor chips. By cutting a semiconductor wafer on which these steps have been done, it is possible to manufacture a plurality of semiconductor devices of a chip-on-chip structure with efficiency and at low cost.

In the case the on-substrate connecting step is to arrange and connect a plurality of first semiconductor chips side by side in an area of the semiconductor wafer corresponding to the second semiconductor chip (one semiconductor device), it is possible to obtain a semiconductor device having a structure that a plurality of first semiconductor chips are arranged side by side on the second semiconductor chip. In this case, the recesses arranging conductors therein may be formed in the active surfaces of all the first semiconductor chips or may be formed only in the active surfaces in part of the first semiconductor chips.

In the case this manufacturing method includes a step to connect one or a plurality of other semiconductor chips (third semiconductor chips or the like) on at least one first semiconductor chip, it is possible to obtain a semiconductor device forming a plurality of blocks each structured with one or a plurality of vertically superposed semiconductor chips on the semiconductor substrate. Such a semiconductor device is high in integration degree.

The one surface of the semiconductor substrate may be an active surface. In this case, the above method preferably further includes a substrate polish step to reduce the thickness by polishing or abrading the inactive surface of the semiconductor substrate.

The semiconductor substrate may have a sufficient thickness in order not to be readily broken during carrying out the steps. In also this case, it is possible to sufficiently reduce the thickness of the second semiconductor chip finally obtained by the substrate polish step. This can make the semiconductor device small in size and enhance the integration degree thereof.

The substrate polish step can be carried out by a method similar to that on the first semiconductor chip.

The semiconductor substrate may be formed, in the active surface, with a recess arranging a conductor therein. In this case, the substrate polish step preferably includes a step of polishing or abrading the inactive surface of the semiconductor substrate to expose the conductor of within the semiconductor substrate at the inactive surface of the semiconductor substrate.

The conductor in the semiconductor substrate may be filled in the recess or arranged in a part of the recess in a thickness direction of the semiconductor substrate. The conductor can be connected to a wiring provided on the active surface of the semiconductor substrate formed with the recess.

By polishing or abrading the inactive surface of the semiconductor substrate forming the recess in the active surface to expose the conductor, it is possible to obtain a penetration hole penetrating the semiconductor substrate in the thickness direction. Because the conductor is arranged in the penetration hole, the penetration hole in a final form of semiconductor device can play a role as a via hole or through-hole electrically connecting between the active surface and the inactive surface of the second semiconductor chip. After exposing the conductor, polish or abrasion may be continued until the semiconductor substrate becomes sufficiently small in thickness. This can reduce the thickness of the second semiconductor chip and hence of the entire semiconductor device, and further shorten the wiring length of between the active surface and the inactive surface of the semiconductor substrate (conductor length).

Prior to carrying out the step of polishing or abrading the semiconductor substrate, a step may be made of sealing the first semiconductor chip with an insulator. In this case, the semiconductor substrate is made in a state being reinforced by the insulator or first semiconductor chips. Accordingly, because the semiconductor device when polished or abraded is not readily broken, the semiconductor substrate can be worked to a small thickness.

A step may be included of forming a bump (for example, connecting solder ball) as an external-connection electrode on the inactive surface of the semiconductor substrate (second semiconductor chip). Where the conductor is filled within the penetration hole of the semiconductor substrate, the external-connection electrode may be directly connected to the conductor. Meanwhile, a wiring may be formed on the inactive surface of the semiconductor substrate to connect between the external-connection electrode and the conductor in the penetration hole via the wiring. The semiconductor device obtained can be directly connected on another wiring board or the like through the external-connection electrodes. Namely, such a semiconductor device can be reduced in size because of the unnecessity of an interposer for externally connecting the semiconductor chip as required in the multi-chip module.

The above method may further include an on-chip connecting step of connecting, onto the semiconductor chip, another semiconductor chip.

The other semiconductor chip (third semiconductor chip) may have an internal-connection electrode on the active surface. In this case, the internal-connection electrode of the third semiconductor chip may be directly connected to the conductor exposed in the inactive surface of the first semiconductor chip or be connected through a wiring or electrode pad. The conductor in the first semiconductor chip can connect between the inactive surface of the first semiconductor chip and the active surface of the third semiconductor chip at a short distance (in the shortest, nearly a thickness of the first semiconductor chip). The wiring length is shortened by reducing the thickness of the first semiconductor chip due to polish or abrasion.

In the case the other semiconductor chip has an active surface formed with a recess arranging a conductor therein, the on-chip connecting step is preferably to connect face down the other semiconductor chip on the semiconductor chip. In this case, the above method preferably further includes a step of polishing or abrading an inactive surface of the other semiconductor chip to expose the conductor of within the other semiconductor chip at the inactive surface of the other semiconductor chip.

By connecting face down the other semiconductor chip (third semiconductor chip) on the semiconductor chip (first semiconductor chip), the third semiconductor chip is placed in a state that its active surface faces the first semiconductor chip while its inactive surface is open. Consequently, it is possible in this state to polish or abrade the inactive surface of the third semiconductor chip.

By this manufacturing method, obtained is a penetration hole penetrating the third semiconductor chip in the thickness direction. Still another semiconductor chip or wiring may be arranged on the third semiconductor chip. In this case, electrical connection can be made at a short wiring length between the active surface of the third semiconductor chip and the other semiconductor chip or wiring through the penetration hole of the third semiconductor chip as a via hole or through-hole.

Because it is possible to arbitrary define a recess providing position on the inactive surface of the first and third semiconductor chip, the penetration holes in the first and third semiconductor chips are independent in position of each other in an obtained semiconductor device. Namely, in the obtained semiconductor device, the penetration hole of the third semiconductor chip can be in a position immediately above the penetration hole of the first semiconductor chip or in a position other than that.

The conductors of the first semiconductor chip and third semiconductor chip, in the obtained semiconductor device, may each be directly connected to form a common electrode. Otherwise, such a common electrode may not be formed. In the case that each of the first and third semiconductor chips has a plurality of recesses, the penetration holes in plurality respectively arranging conductors therein are obtained in each of the first and third semiconductor chips. In this case, the conductors of the first semiconductor chip and third semiconductor chip may form common electrodes, in part of combinations. Otherwise, all the combinations may form common electrodes. Otherwise, no common electrodes may be formed.

After exposing the conductor, polish or abrasion may be continued to reduce the thickness until the third semiconductor chip comes to a desired thickness. This can reduce the thickness of the entire semiconductor device.

Similarly, a step may be carried out of connecting yet another semiconductor chip (fourth semiconductor chip) on the third semiconductor chip. A recess arranging a conductor therein may be formed in an active surface of the fourth semiconductor chip. In this case, a process may be carried out that, after connecting face down the fourth semiconductor chip onto the third semiconductor chip, an inactive surface of the fourth semiconductor chip is polished or abraded to expose the conductor in the fourth semiconductor chip in its inactive surface. By repeating such process, it is possible to obtain a semiconductor device having a structure that a plurality of semiconductor chips are vertically superposed on the semiconductor substrate. The semiconductor chips adjacent in the superposing direction are electrically connected with each other at a short wiring length by the conductors in the penetration holes. Such a semiconductor substrate has a high integration degree.

A method for manufacturing a semiconductor device according to another aspect of the invention includes: a step of connecting a semiconductor chip on an active surface of a semiconductor substrate formed, in the active surface, with a recess arranging a conductor therein; and a step of polishing or abrading an inactive surface of the semiconductor substrate to expose the conductor of within the semiconductor substrate at the inactive surface of the semiconductor substrate.

This method can obtain a semiconductor device short in external-connection wiring length (conductor length) but high in integration degree. The semiconductor device obtained by such a manufacturing method is structured with a combination of a plurality of semiconductor chips, similarly to the multi-chip module. Namely, manufacture cost is low because of difference from the integration of all the functions on one semiconductor chip as in the system-on-chip.

A method according to still another aspect of the invention includes: an on-substrate connecting step of connecting face down a semiconductor chip on a semiconductor substrate; and a step of polishing or abrading an inactive surface of the semiconductor chip to reduce a thickness of the semiconductor chip after the on-substrate connecting step.

By the on-substrate connecting step, the semiconductor chip is placed in a state that its active surface faces the semiconductor substrate while the inactive surface is open.

Accordingly, it is possible in this state to easily polish or abrade the inactive surface of the semiconductor chip.

Because this manufacturing method can reduce the thickness of the semiconductor chip, it is possible to obtain a semiconductor device small in thickness but high in integration degree.

A semiconductor device according to another aspect of the invention is a semiconductor device having a structure with a plurality of semiconductor chips superposed, wherein at least one of the semiconductor chips has a penetration hole arranging a conductor therein and penetrating the semiconductor chip in a thickness direction. Such a semiconductor is high in integration degree but low in manufacture cost.

The plurality of semiconductor chips may include a first semiconductor chip having a first penetration hole arranging a conductor therein and a second semiconductor chip superposed adjacent to the first semiconductor chip and having a second penetration hole arranging a conductor therein in a position deviated from the first penetration hole.

The second semiconductor chip may have a plurality of second penetration holes. In this case, every second penetration hole may be arranged in a position deviated from the first penetration hole. In this case, the conductor arranged in the first penetration hole is in a position deviated from the conductor arranged in the second penetration hole. Accordingly, it is easy to provide a structure such that the conductor in the first semiconductor chip is not in direct connection (not to form a common electrode) with the conductor in the second semiconductor chip. Such a semiconductor device has a high freedom of design.

The above or further other objects, features and effects will be made more apparent by the ensuing embodiments to be described with reference to the accompanying drawings.

DESCRIPTION OF THE PREFERRED EMBODIMENTS

Figure 1:
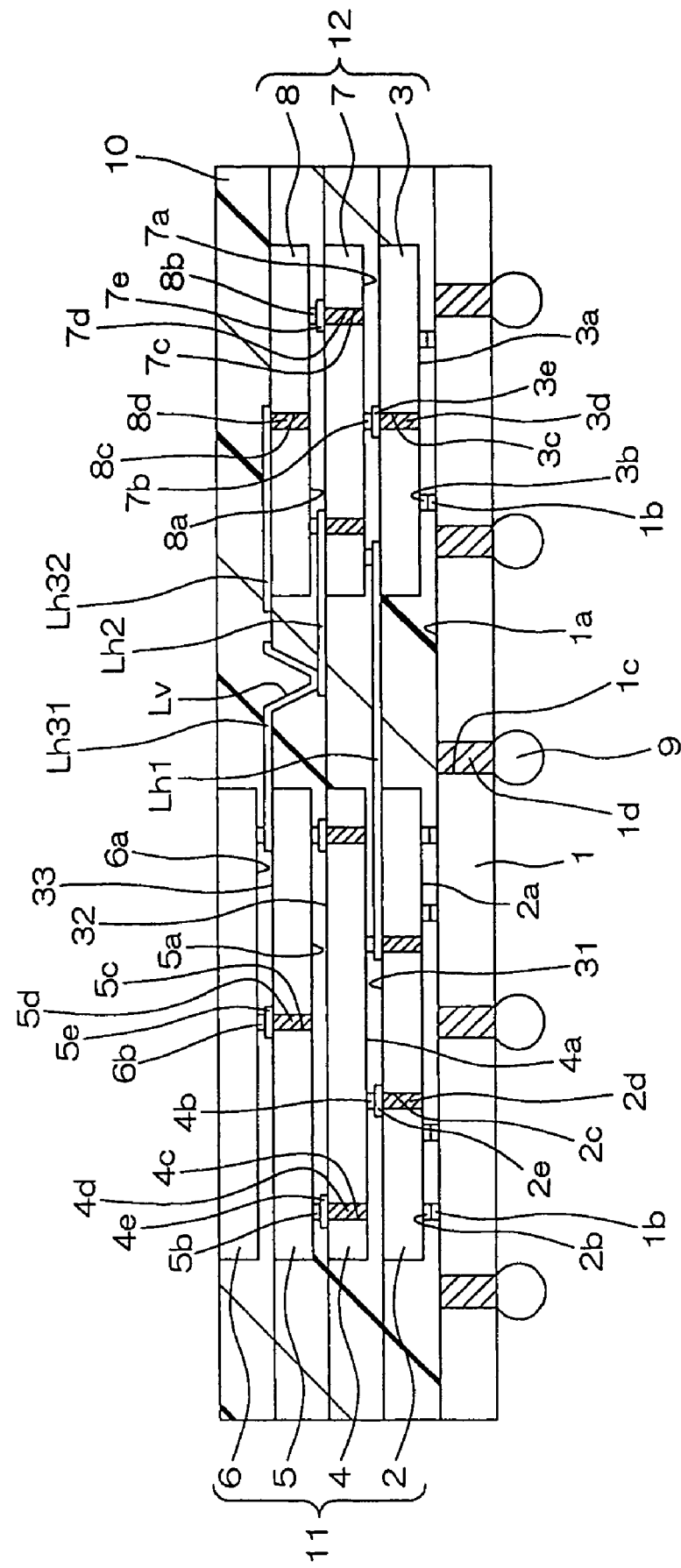
FIG. 1 is an illustrative sectional view showing a structure of a semiconductor device according to an embodiment of the present invention.

FIG. 1 is an illustrative sectional view showing a structure of a semiconductor device according an embodiment of the present invention.

A parent chip 1 is a semiconductor chip having external-connection electrodes (bumps 9), which is connected thereon with chip blocks 11, 12 each having a plurality of semiconductor chips (child chips) vertically superposed one upon another. Namely, the parent chip 1 serves as a support semiconductor chip to support the chip blocks 11, 12. The chip block 11 includes four child chips 2, 4, 5, 6 arranged one over another from a proximate end toward a distal end to the parent chip 1. The chip block 12 includes three child chips 3, 7, 8 arranged one over another from a proximate end toward a distal end to the parent chip 1. On the parent chip 1, polyimide resin 10 covers laterally the chip blocks 11, 12 and over the chip block 12. This structures the semiconductor device nearly in a cuboid form.

The parent chip 1, the child chip 2 and child chip 3 have opposed surfaces respectively made as active surfaces $1a$ and $2a$, $3a$. Herein, the active surface is a surface forming functional elements and wirings thereon. The child chips 4–8 respectively have active surfaces $4a$–$8a$ at their lower surfaces (surfaces close to the parent chip 1). Namely, the child chips 2–8 are connected face down on the parent chip 1 or child chip 2–5. The semiconductor chip (parent chip 1 or child chip 2–8) has an inactive surface opposite to the active surface ($1a$–$8a$), having no functional elements formed thereon. The active surface $1a$–$8a$ has an internal-connection electrode $1b$–$8b$.

The child chip 2–5, 7, 8 has a penetration hole (via hole) $2c$–$5c$, $7c$, $8c$ penetrating through it in a thickness direction. The penetration hole $2c$–$5c$, $7c$, $8c$ is filled therein with an electrical conductor $2d$–$5d$, $7d$, $8d$. The conductor $2d$–$5d$, $7d$, $8d$ is electrically connected to an wiring (not shown) formed on the active surface $2a$–$5a$, $7a$, $8a$ of the child chip 2–5, 7, 8. The child chip 6, positioned in the uppermost of the chip block 11, is not provided with a penetration hole.

The conductor $2d$–$5d$, $7d$, at its top end, is connected with an electrode pad $2e$–$5e$, $7e$. Also, some of the conductors $2d$, $3d$, $5d$, $7d$, at their top ends, are connected with any of intralevel wirings Lh1, Lh2, Lh31 in place of the electrode pad. The conductor $8d$, at its top end, is connected with an intralevel wiring Lh32.

The internal-connection electrode $2b$, $3b$ of the child chip 2, 3 is connected to the internal-connection electrode $1b$ of the parent chip 1. The internal-connection electrode $4b$ of the child chip 4 is connected to either of the electrode pad $2e$ or the intralevel wiring Lh1 provided on the upper surface (inactive surface) of the child chip 2. Similarly, the internal-connection electrode $5b$, $6b$, $7b$, $8b$ is connected to either of the electrode pad $4e$, $5e$, $3e$, $7e$ or the intralevel wiring Lh1, Lh2, Lh31 provided on the upper surface of the adjacent child chip 4, 5, 3, 7.

The child chip 2 at its upper surface (inactive surface) and the child chip 3 at its upper surface are nearly on the common plane (on the first wiring plane 31). The intralevel wiring Lh1 is provided in a manner extending on the plane. The child chip 4 at its upper surface and the child chip 7 at its upper surface are nearly on the common plane (on the second wiring plane 32). The intralevel wiring Lh2 is provided in a manner extending on this plane. The child chip 5 at its upper surface and the child chip 8 at its upper surface are nearly on the common plane (on the third wiring plane 33). The intralevel wirings Lh31, Lh32 are provided in a manner extending on this plane. Also, an interlevel wiring Lv having a funnel form (V-form in section) is formed extending between the planes respectively including the second wiring plane 32 and the third wiring plane 33.

The intralevel wiring Lh1 is connected to the conductor $2d$ and internal-connection electrodes $4b$, $7b$. Namely, the child chips 2, 4, 7 are mutually electrically connected by the intralevel wiring Lh1. The intralevel wiring Lh2 is connected to the conductor $7d$, the internal-connection electrode $8b$ and the interlevel wiring Lv. The interlevel wiring Lv is integrally formed with the intralevel wiring Lh31, and the intralevel wiring Lh31 is connected to the internal-connection electrode $6b$. Namely, the child chips 6–8 are mutually electrically connected by the intralevel wiring Lh2, Lh31 and interlevel wiring Lv. The intralevel wiring Lh32, at its point outside the section shown FIG. 1, is connected to other child chips via the other intralevel wirings (and interlevel wirings).

The parent chip 1 is formed with a penetration hole $1c$ penetrating the parent chip 1 in a thickness direction. The penetration hole $1c$ is filled therein with a conductor $1d$. The conductor $1d$ is connected to an wiring (not shown) formed on the active surface $1a$. The conductor $1d$, at its bottom end (close to the inactive surface of the parent chip 1), is formed with a bump 9 nearly in a spherical form. Namely, the wiring formed on the active surface 1a and the bump 9 are electrically connected together by the conductor 1d. Through the bumps 9, the semiconductor device can be directly mounted on a wiring board. Namely, the semiconductor device like this can be reduced in size because of not requiring an interposer for externally connecting a semiconductor chip, such as a multi-chip module (MCM) wiring board.

This semiconductor device is structured with a combination of a plurality of semiconductor chips (parent chip 1 and child chips 2–8), just like a multi-chip module. Namely, this does not integrate all the functions on one semiconductor chip as in the system-on-chip (SOC), and hence is low in manufacture cost.

In the semiconductor device thus structured, the child chip 2–5, 7 is in electrical connection with the other child chips 2–8 adjacent to the above and below, through the conductors 2d–5d, 7d filled in the penetration holes 2c–5c, 7c. Accordingly, the wiring length at between the child chips 2–8 mutually adjacent in the superposing direction is minimally nearly equal to the thickness of the child chip 2–5, 7, hence being short in wiring distance.

Furthermore, direct connection is provided between the child chips 2, 4–6 constituting the chip block 11 and the child chips 3, 7, 8 constituting the chip block 12 by the intralevel wirings Lh1, Lh2, Lh31, Lh32 and interlevel wiring Lv, thus giving a short wiring length between them. This is because, in the case of an absence of the intralevel wirings Lh1, Lh2, Lh31, Lh32 and interlevel wiring Lv, connection must be made between the child chips 2, 4–6 constituting the chip block 11 and the child chips 3, 7, 8 constituting the chip block 12 necessarily through the wiring formed on the active surface 1a of the parent chip 1.

For example, considered is a case to connect between the child chip 6 and the child chip 7. First, in order to connect the child chip 6 to the wiring formed on the active surface 1a, connection must be via the electrode pad 5e, the conductor 5d, the wiring formed on the active surface 5a, the internal-connection electrode 5b, the electrode pad 4e, the conductor 4d, the wiring formed on the active surface 4a, the internal-connection electrode 4b, the electrode pad 2e, the conductor 2d, the internal-connection electrode 2b and the internal-connection electrode 1b. Furthermore, in order to connect between the wiring formed on the active surface 1a and the child chip 7, connection must be via the internal-connection electrode 1b, the internal-connection electrode 3b, the wiring formed on the active surface 3a, the conductor 3d and the electrode pad 3e. For this reason, there encounters an increase in wiring length in both directions vertical to and parallel with the active surface 1a.

On the contrary, in the present semiconductor device, the child chip 6 and the child chip 7 are connected together through only the internal-connection electrode 6b, intralevel wiring Lh31, interlevel wiring Lv and intralevel wiring Lh2. Accordingly, the wiring length is short in the both directions vertical to and parallel with the active surface 1a.

The electrical connection of between the child chip 2 and the child chip 3 can also be reduced in wiring length by the wiring formed on the active surface 1a of the parent chip 1. However, by providing a connection between the child chip 2 and the child chip 3 at least in one part thereof through the intralevel wiring Lh1, wiring can be dispersed with a result of wiring with density. Similarly, although the child chip 8 and the other child chip 2–7 can be connected through the intralevel wiring Lh2 arranged on the active surface 8a of the child chip 8, an wiring made from the inactive surface of the child chip 8 via the conductor 8d can disperse wiring with a result of wiring with density.

Meanwhile, the parent chip 1 is short in the wiring length for external connection because external connection is via the conductor 1d filled in the penetration hole 1c and the bump 9. The conductor 1d can be decreased in the length in thickness direction of the parent chip 1 by structuring the parent chip 1 small in thickness.

As described in the above, the semiconductor device can transmit signals at high speed because of its short wiring length. Also, the semiconductor device is high in integration degree because its thickness can be configured small. Meanwhile, because arbitrary two of the child chips 2–8 can be connected at a short wiring length by the intralevel wirings Lh1, Lh2, Lh31, Lh32 and interlevel wiring Lv, there is less restriction in chip arrangement hence increasing the design freedom of semiconductor device.

The conductor 1d–5d, 7d, 8d may not be filled fully in the penetration hole 1c–5c, 7c, 8c, but may be provided in part of the internal space thereof (e.g. along the inner peripheral wall). Also, it is possible to desirably determine a position of the penetration holes 1c–5c, 7c, 8c in the parent chip 1 and child chips 2–5, 7, 8. Namely, the penetration hole 2c–5c, 7c, 8c of the child chip 2–5, 7, 8 is arranged regardless of (or in different position from) the position of the adjacent below one of the penetration hole 1c of parent chip 1 and the penetration hole 2c, 4c, 3c, 7c of child chip 2, 4, 3, 7. Of course, these may be arranged in a relationship of immediately above/below.

Furthermore, the conductor 2d–5d, 7d, 8d of the child chip 2–5, 7, 8 may be directly connected to form a common electrode with the adjacent below one of the conductor 1d of parent chip 1 or with the conductor 2d, 4d, 3d, 7d of child chip 2, 4, 3, 7. Otherwise, they may not form such a common electrode. Meanwhile, of these conductors 1d–5d, 7d, 8d, some combinations may form common electrodes or all the combinations may form common electrodes. Otherwise, no common electrodes may be formed.

It is possible to define the number of child chips 2–8 structuring the chip block 11, 12, i.e. maybe one or a plurality. The intralevel wirings Lh1, Lh2, Lh31, Lh32 and the interlevel wiring Lv can be provided to connect between arbitrary one of the child chips 2, 4–6 constituting the chip block 11 and arbitrary one of the child chips 3, 7, 8 constituting the chip block 12. Furthermore, the interlevel wiring Lv can be provided to connect between arbitrary ones of the wiring planes (first to third wiring planes 31–33). It may connect between non-adjacent ones of wiring planes, e.g. between the first wiring plane 31 and the third wiring plane 33.

Any of the child chips 2–8 constituting the chip block 11, 12 may support, thereon, a plurality of chip blocks (small blocks) having child chips smaller in width (smaller in length in a direction vertical to the thickness) than the child chip 2–8. In this case, the child chip 2–8 supporting the small chips serves as a support semiconductor chip.

The number of chip blocks 11, 12 may be one or three or more.

The child chip 6, at the above thereof, maybe structurally covered with polyimide resin 10. In such a case, a heat-sink formed by a metal foil (plate) or the like may be attached on a surface of the polyimide resin 10. Instead of polyimide resin 10, may be used a resin containing imide bond or acid bond or both imide and acid bonds. Otherwise, an insulator other than resin may be used.

The parent chip 1, at its inactive surface, may not be connected with bumps 9. In this case, the semiconductor device can be mounted on a wiring board, for example, by applying cream solder to the electrode pad formed on the wiring board or the like and connecting it to the conductor 1d.

FIGS. 2A–2H are illustrative sectional views for explaining a method for manufacturing a semiconductor device of FIG. 1. The semiconductor wafer 15 shown in FIGS. 2A–2H is the one in which, on a surface of the semiconductor wafer 15, a multiplicity of the regions corresponding to the parent chip 1 of semiconductor device in the final form shown in FIG. 1 are densely arranged. Although FIGS. 2A–2H each shows only a region (unit region) corresponding to substantially one semiconductor device, the following process can be carried out commonly on every unit region.

First, recesses 21 are formed in an active surface 15a of a semiconductor wafer 15 formed with internal-connection electrodes 1b, and then conductor 1d is filled in the recesses 21. The semiconductor wafer 15, at this time, is greater in thickness than the parent chip 1 of semiconductor device in the final form shown in FIG. 1. The semiconductor wafer 15 can be given a thickness having an enough mechanical strength not to be broken during the semiconductor device manufacture process. The thickness may be given greater when using a greater diameter of semiconductor wafer 15. The recess 21 can be formed by drilling or laser working, for example. Filling a conductor 1d in the recess 21 can be by using a conductor paste, for example.

Figure 2A:
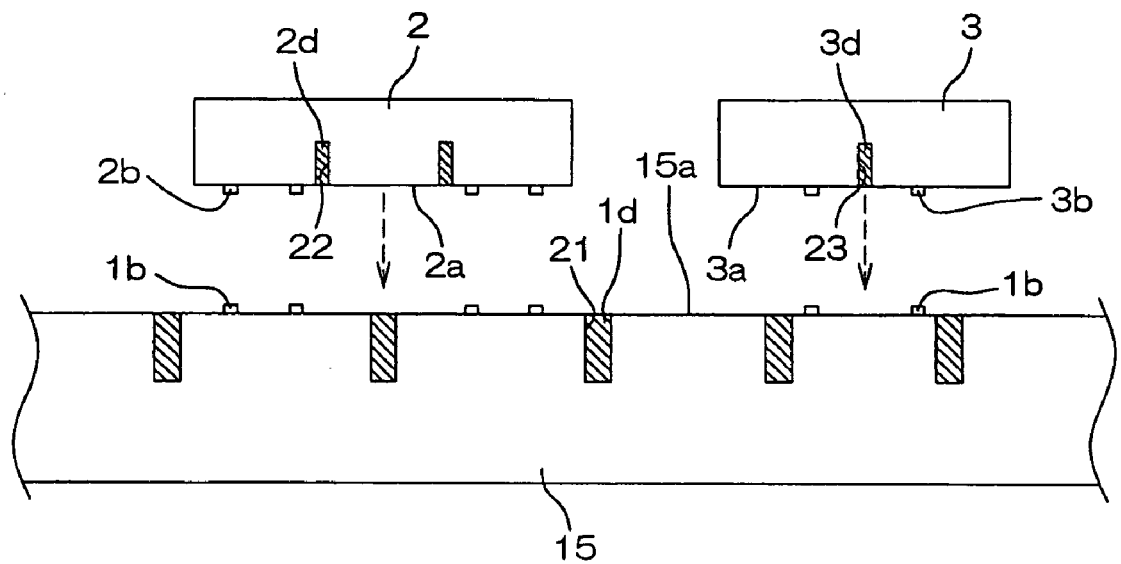
FIGS. 2A–2H are illustrative sectional views showing, in a process order, a method for manufacturing a semiconductor device according to an embodiment of the invention.

Similarly, recesses 22, 23 are respectively formed in the active surfaces 2a, 3a of the child chips 2, 3 formed with internal-connection electrodes 2b, 3b, and then conductors 2d, 3d are filled in the recesses 22, 23 (FIG. 2A). The child chip 2, 3, at this time, is greater in thickness than the child chip 2, 3 of semiconductor device in the final form.

Figure 2B:
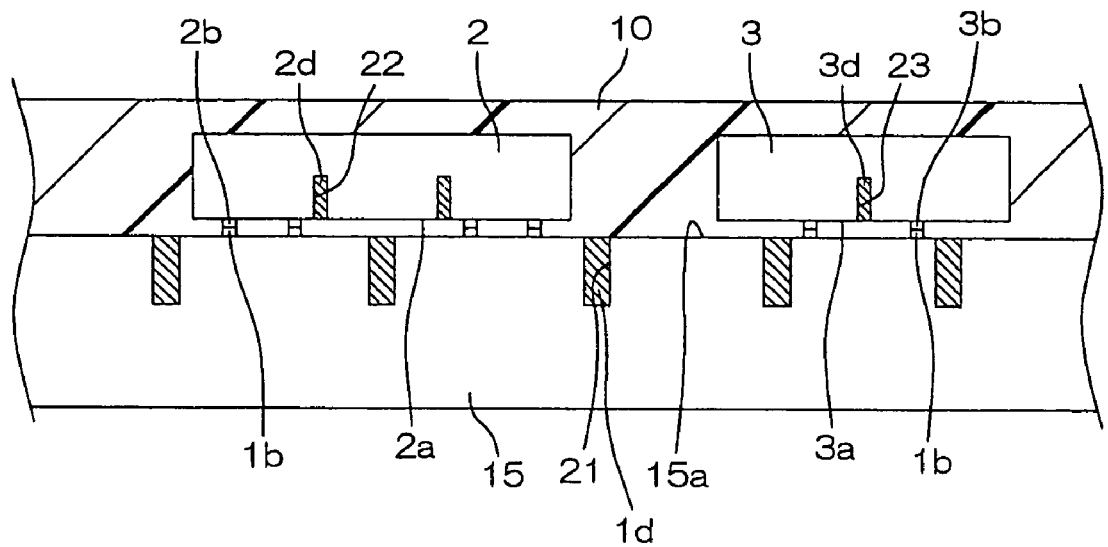

Then, the active surface 15a and the active surface 2a, 3a are placed opposed in parallel with each other (child chip 2, 3 put faced down), and the internal-connection electrode 2b, 3b is aligned with the corresponding internal-connection electrode 1b in a direction of the active surface 2a, 3a. Subsequently, the active surface 15a and the active surface 2a, 3a are put close to each other, to connect (join) the internal-connection electrode 1b and the internal-connection electrode 2b, 3b together. Thereafter, polyimide resin 10 is formed covering the child chip 2, 3 on the active surface 15a (FIG. 2B). The polyimide resin 10 is formed in a manner burying therein the inactive surface of the child chip 2, 3. The polyimide resin 10 can be obtained by applying, for example, a solution of polyamic acid, a precursor of polyimide resin 10, over the active surface 15a of the semiconductor wafer 15 and heating the precursor at a proper temperature.

Figure 2C:
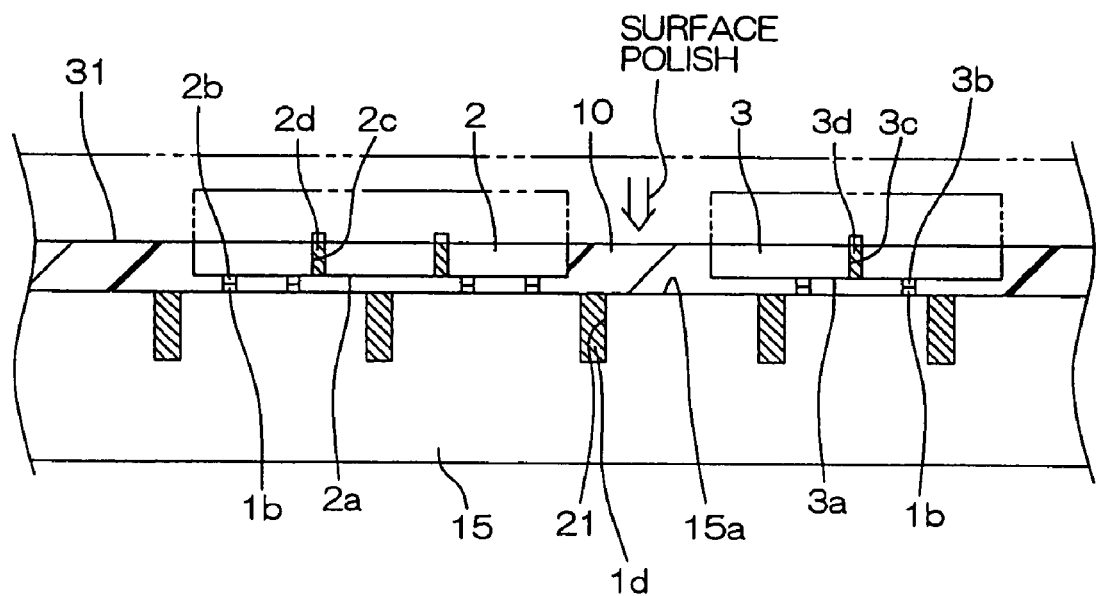

Then, polish (surface polish) is made on the surface of the polyimide resin 10. This process may be by physical abrasion or polish or by chemical polish (fusion) such as etching. When carrying out surface polish, for example the semiconductor wafer 15 at its inactive surface can be held on a support plate through an adhesive tape or absorbed on a support plate capable of sucking it. By surface polish, the polyimide resin 10 is removed to expose the inactive surface of the child chip 2, 3. Furthermore, the polyimide resin 10 and the inactive surface 2a, 3a of child chip 2, 3 are polished to expose the conductor 2d, 3d of in the recess 22, 23. Due to this, the recess 22, 23 turns into a penetration hole 2c, 3c penetrating the child chip 2, 3 in its thickness direction. This state is shown in FIG. 2C.

After surface polish, the inactive surface of child chip 2, 3 and the surface of polyimide resin 10 turn into a first wiring plane 31 in flush. Even after exposing the conductor 2d, 3d, surface polish may be continued to a desired thickness of child chip 2, 3, thus reducing the thickness of child chip 2, 3. This makes it possible to reduce the thickness of the semiconductor device overall and the length of conductor 2d, 3d (wiring length) in a thickness direction of the child chip 2, 3.

Because the child chip 2, 3 is mechanically protected by the polyimide resin 10, there is no possibility of damaging the child chip 2, 3 or the connection of the child chip 2, 3, with the semiconductor wafer by the stress encountered during surface polish. Accordingly, the child chip 2, 3 can be worked to a small thickness.

Figure 2D:
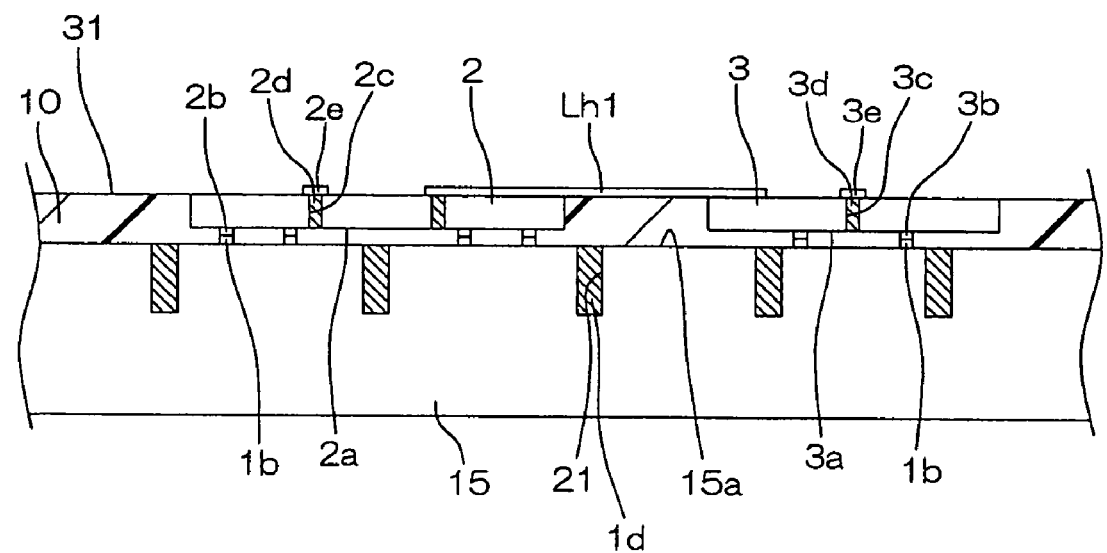

Subsequently, on the first wiring plane 31, electrode pads 2e, 3e are respectively formed on the conductors 2d, 3d, and an intralevel wiring Lh1 is formed in a predetermined position on an inactive surface of child chip 3 and on a surface of polyimide resin 10 (FIG. 2D). Showing one example of forming electrode pads 2e, 3e and intralevel wiring Lh1, at first a predetermined surface area of the polyimide resin 10 is treated by a solution of potassium hydroxide, to thereby open the polyimide ring in a surface of the polyimide resin 10 and introduce carboxyl to the surface of the polyimide resin 10. By treating a surface of the polyimide resin 10 thus surface-reformed in a predetermined region with using a solution containing metal ions (e.g. copper sulfate solution), ion-exchange reaction is caused to form a thin metal film. After forming a thin metal film also in a predetermined position on the child chip 2, 3 by a proper process, electrolytic plating is carried out on these thin metal films by energizing them to increase the thickness thereof. Thus, it is possible to form films of electrode pads 2e, 3e and intralevel wiring Lh1. This can form electrode pads 2e, 3e and an intralevel wiring Lh1 in batch at the same time.

Next, a recess 24, 27 is formed in an active surface 4a, 7a of the child chip 4, 7 formed with the internal-connection electrode 4b, 7b, to fill a conductor 4d, 7d in the recess 24, 27. The child chip 4, 7 at this time is greater in thickness than the child chip 4, 7 of the semiconductor device in the final form shown in FIG. 1. Then, the first wiring plane 31 and the active surfaces 4a and 7a are opposed in parallel with each other, to align the internal-connection electrodes 4b, 7b with the corresponding electrode pads 2e, 3e or the intralevel wiring Lh1 in a direction of the active surface 4a, 7a.

Figure 2E:
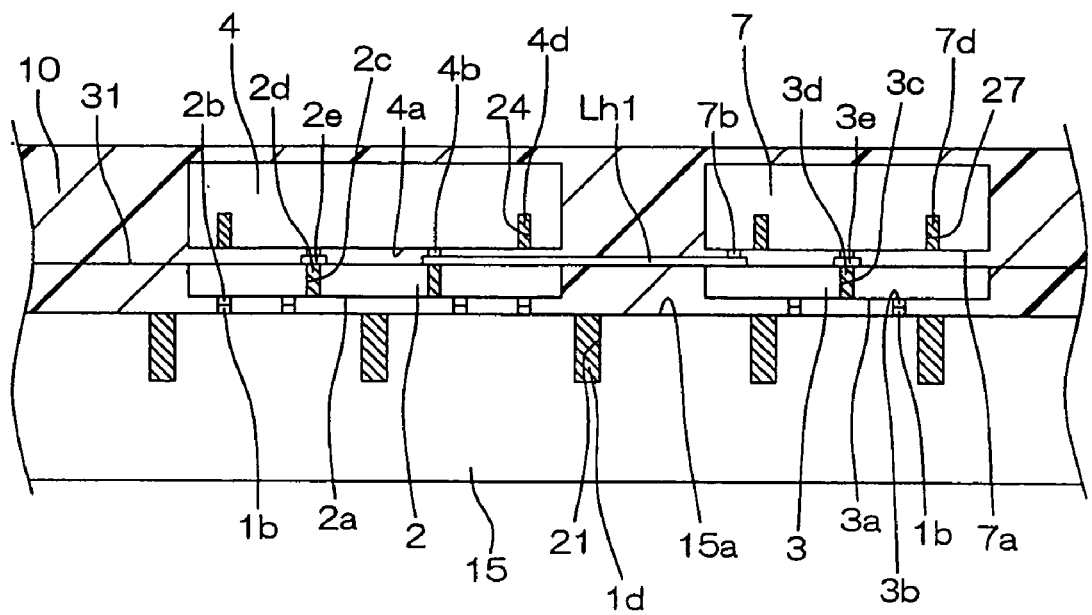

Subsequently, the first wiring plane 31 and the active surfaces 4a, 7a are placed close to each other, to connect (join) the internal-connection electrode 4b, 7b and electrode pad 2e, 3e, and the intralevel wiring Lh1 and correspondent internal-connection electrodes. This connects the child chips 4, 7 face down on the first wiring plane 31. Thereafter, on the first wiring plane 31, polyimide resin 10 is formed covering the child chips 4, 7 (FIG. 2E).

From then on, surface polish is similarly carried out until the conductors 4d, 7d are exposed. This makes the recesses 24, 27 into penetration holes 4c, 7c. The inactive surface of child chip 4, 7 and the surface of polyimide resin 10 are made into a second wiring plane 32 in flush. Subsequently, on the second wiring plane 32, electrode pads 4e, 7e are formed on the conductors 4d, 7d and an intralevel wiring Lh2 is formed in a predetermined arean on the inactive surface of child chip 7 and on the surface of polyimide resin 10.

Furthermore, a similar process is carried out by using child chips 5, 8 respectively formed with internal-connection electrodes 5b, 8b. This connects the internal-connection electrodes 5b, 8b and electrode pads 4e, 7e and the intralevel wiring Lh2. The child chips 5, 8 is thickness-reduced by polish to form penetration holes 5c, 8c filled with conductors 5d, 8d. The inactive surface of the child chip 5, 8 and the surface of polyimide resin 10 are made into a third wiring plane 33 in flush.

Figure 2F:
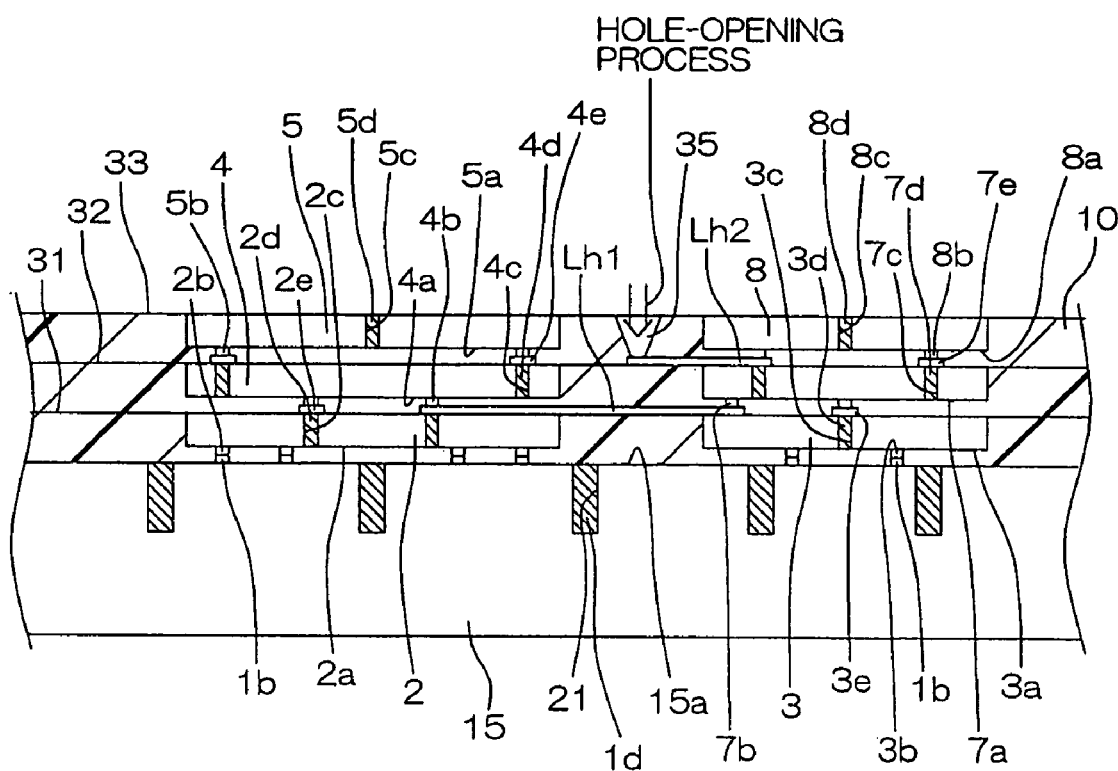

In this state, a hole-opening process is carried out on the polyimide resin 10 at above of a predetermined point of the intralevel wiring Lh2. This process can be made by laser working or etching. This forms a via hole 35 in a sectionally V-form in the polyimide resin 10 of between the second wiring plane 32 and the third wiring plane 33, thereby exposing a part of the interlevel wiring Lh2 (FIG. 2F).

Thereafter, an electrode pad 5e, intralevel wirings Lh31, Lh32 and an interlevel wiring Lv are formed in predetermined positions. The interlever wiring Lv is formed on an inner periphery of the via hole 35 and on an exposed portion of the intralevel wiring Lh2 from the bottom of the via hole 35. This process can be carried out by the method exemplified as the method for forming an intralevel wiring Lh1. This can integrate the intralevel wiring Lh31 and the interlevel wiring Lv together, wherein these can be simultaneously formed with the electrode pad 5e and intralevel wiring Lh32 in batch.

Figure 2G:
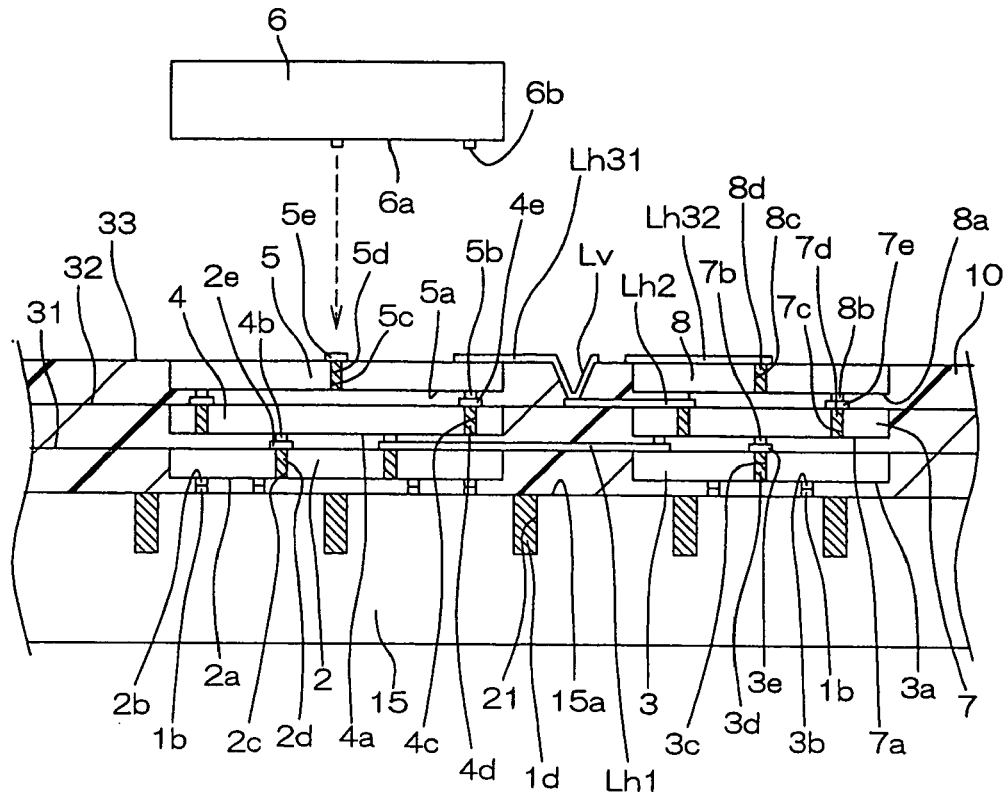

Subsequently, a child chip 6 formed with an internal-connection electrode 6b on its active surface 6a is connected face down such that the internal-connection electrode 6b is joined to an electrode pad 5e and intralevel wiring Lh31 (FIG. 2G). No recesses are formed in the child chip 6. After forming polyimide resin 10 covering the child chip 6 on the third wiring plane 33, surface polish is conducted to make the child chip 6 of a predetermined thickness.

Furthermore, polish is made on the inactive surface of the semiconductor wafer 15 (backside polish) until the conductor 1d is exposed. This makes the recess 21 into a penetration hole 1c. After exposing the conductor 1d, backside polish may be continued in order to reduce the thickness of the semiconductor wafer 15. This can reduce the thickness of the entire semiconductor device and shorten the length (wiring length) of the conductor 1d in a thickness direction of the semiconductor wafer 15 (parent chip 1).

During backside polish, the semiconductor wafer 15 will not be broken by backside polish because it is in a reinforced state due to the polyimide resin 10 and child chips 2–8 formed on the active surface 15a thereof. A bump 9, such as a solder ball, is connected to the exposed conductor 1d.

Figure 2H:
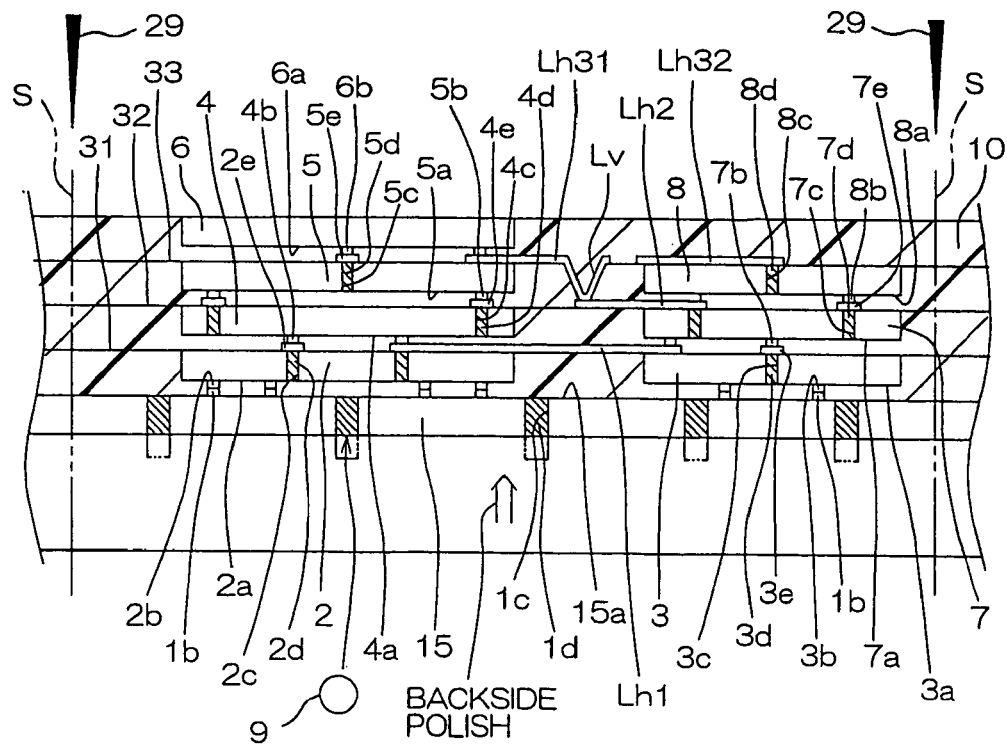

Thereafter, as shown in FIG. 2H, the semiconductor wafer 15 is cut, together with the polyimide resin 10, along scribe lines (cutting lines) by a dicing saw 29. Due to this, from the semiconductor wafer 15 is cut an individual piece of semiconductor device having a parent chip 1 joined thereon with child chips 2–8 as shown in FIG. 1.

The above manufacturing method is on the example that each process is carried out, in batch, on the regions corresponding to a plurality of semiconductor devices on the semiconductor wafer 15. With the manufacturing method like this, a plurality of chip-on-chip-structured semiconductor devices can be manufactured with efficiency. However, the invention is not limited to this, the process may be carried out on one piece of parent chip 1 to obtain such a semiconductor device.

The via hole 35 for forming an interlevel wiring Lv may be formed by drilling. In such a case, obtained is a via hole 35 having a nearly constant diameter with respect to the thickness direction of the polyimide resin 10, which however has no effect upon forming an interlevel wiring Lv with using ion exchange or the like. In a case that there is no need to form intralevel wiring Lh1, Lh2, Lh31, Lh32 in batch with an interlevel wiring Lv, unwanted portions may be removed by etching after laminating metal foils (e.g. coppe foils) over the entire surfaces of the first to third wiring planes 31–33.

Although the embodiments of the present invention have been explained in detail, there are mere concrete examples used to set forth the subject matter of the invention. The invention should not be construed limited to the concrete examples but the spirit and scope of the invention can be limited only by the attached claims.

This invention corresponds to Japanese Patent application Nos. 2001-336827 and 2001-338110 respectively filed with Japanese Patent Office on Nov. 1, 2001 and November 2 in the same year, all the disclosure of which applications are incorporated herein by reference.

What is claimed is:

1. A method for manufacturing a semiconductor device including:
   a step of connecting, to one surface of a support semiconductor chip, first and second chip blocks each including one or a plurality of semiconductor chips having an active surface substantially parallel with the one surface of the support semiconductor chip;
   a step of arranging an insulator between the first and second chip blocks; and
   a step of forming, within or on a surface of the insulator, an intralevel wiring on a wiring plane as a plane including an inactive or active surface of any of the semiconductor chips constituting the first or second chip block.

2. A method for manufacturing a semiconductor device according to claim 1, wherein a plurality of semiconductor chips are present in the first chip block and a plurality of semiconductor chips are present in the second chip block, and wherein the active or inactive surface of one of the semiconductor chips in the first chip block and the active or inactive surface of one of the semiconductor chips in the second chip block are commonly on the wiring plane.

3. A method for manufacturing a semiconductor device according to claim 1, wherein the step of forming the intralevel wiring includes a step of forming first and second intralevel wirings respectively arranged on first and second wiring planes not in a same plane, and further including a step of forming an interlevel wiring connecting between the first and second intralevel wirings.

4. A method for manufacturing a semiconductor device according to claim 1, further including a step of forming a penetration hole in at least one of the semiconductor chips constituting the first and second chip blocks, and a step of arranging a conductor in the penetration hole.

5. A method for manufacturing a semiconductor device including:
   an on-substrate connecting step of connecting face down a semiconductor chip having an active surface with a recess and a conductor disposed in the recess onto one surface of a semiconductor substrate; and
   a step of polishing or abrading an inactive surface of the semiconductor chip to expose the conductor at the inactive surface of the semiconductor chip after the on-substrate connecting step,
   wherein the semiconductor substrate is a semiconductor wafer, wherein the semiconductor chip is a first semiconductor chip, wherein the on-substrate connecting step comprises arranging and connecting the first semiconductor chip and a second semiconductor chip side by side on the semiconductor wafer, and further including a step of cutting the semiconductor wafer based on a predetermined region that includes at least one of the first and second semiconductor chips to obtain a semiconductor device having a chip-on-chip structure.

6. A method for manufacturing a semiconductor device including:
   an on-substrate connecting step of connecting face down a semiconductor chip having an active surface with a recess and a conductor disposed in the recess onto one surface of a semiconductor substrate; and
   a step of polishing or abrading an inactive surface of the semiconductor chip to expose the conductor at the inactive surface of the semiconductor chip after the on-substrate connecting step,
   wherein the one surface of the semiconductor substrate is an active surface, and further including a substrate polish step of polishing or abrading the inactive surface of the semiconductor substrate to reduce the thickness thereof.

7. A method for manufacturing a semiconductor device according to claim 6, wherein the active surface of the semiconductor substrate has a recess with a conductor therein, the substrate polish step including a step of polishing or abrading the inactive surface of the semiconductor substrate to expose the conductor at the inactive surface of the semiconductor substrate.

8. A method according to claim 5, further including an on-chip connecting step of connecting, on the semiconductor chip, another semiconductor chip.

9. A method according to claim 8, wherein the other semiconductor chip has an active surface with a recess having a conductor therein, the on-chip connecting step being to connect face down the other semiconductor chip on the semiconductor chip, and further including a step of polishing or abrading an inactive surface of the other semiconductor chip to expose the conductor of the other semiconductor chip at the inactive surface of the other semiconductor chip.

10. A method according to claim 6, further including an on-chip connecting step of connecting, on the semiconductor chip, another semiconductor chip.

11. A method according to claim 10, wherein the other semiconductor chip has an active surface with a recess having a conductor therein, the on-chip connecting step being to connect face down the other semiconductor chip on the semiconductor chip, and further including a step of polishing or abrading an inactive surface of the other semiconductor chip to expose the conductor of the other semiconductor chip at the inactive surface of the other semiconductor chip.

* * * * *